(12) United States Patent
Sakui

(10) Patent No.: US 8,637,914 B2
(45) Date of Patent: Jan. 28, 2014

(54) MEMORY CELLS HAVING A PLURALITY OF CONTROL GATES AND MEMORY CELLS HAVING A CONTROL GATE AND A SHIELD

(75) Inventor: Koji Sakui, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 106 days.

(21) Appl. No.: 13/323,956

(22) Filed: Dec. 13, 2011

(65) Prior Publication Data

US 2013/0146960 A1    Jun. 13, 2013

(51) Int. Cl.
*H01L 29/76* (2006.01)

(52) U.S. Cl.
USPC .... 257/314; 257/315; 257/316; 257/E29.129; 257/E29.3

(58) Field of Classification Search
USPC .......... 257/314, 315, 316, 319, 320, E29.129, 257/E29.3
See application file for complete search history.

(56) References Cited

U.S. PATENT DOCUMENTS

| 7,582,529 | B2 | 9/2009 | Matamis et al. |
| 7,618,861 | B2 | 11/2009 | Masukawa et al. |
| 7,736,973 | B2 | 6/2010 | Orimoto et al. |
| 8,369,144 | B2 * | 2/2013 | Sugimae et al. ......... 365/185.07 |
| 2002/0041526 | A1 | 4/2002 | Sugita et al. |
| 2003/0218205 | A1 | 11/2003 | Takamura et al. |
| 2006/0157773 | A1 * | 7/2006 | Yu et al. .......................... 257/314 |
| 2007/0128815 | A1 | 6/2007 | Iino et al. |
| 2007/0243680 | A1 | 10/2007 | Harari et al. |
| 2007/0247906 | A1 | 10/2007 | Watanabe et al. |
| 2011/0249498 | A1 | 10/2011 | Tokiwa et al. |

FOREIGN PATENT DOCUMENTS

| KR | 20010103072 A | 11/2001 |
| WO | WO-2013090400 A1 | 6/2013 |

OTHER PUBLICATIONS

Whang, "Novel 3-dimensional Dual Control-gate with Surrounding Floating-gate (DC-SF) NAND flash cell for 1Tb file storage application", 2010 IEEE International 2010 IEEE International Electron Devices Meeting, (Dec. 2010), 29.7.1-29.7.4.
Yoo, Hyunseung, et al., "New Read Scheme of Variable Vpass-Read for Dual Control Gate with Surrounding Floating Gate (DC-SF) NAND Flash Cell", (2011), 53-56.
"International Application Serial No. PCT/US2012/069201, International Search Report mailed Mar. 29, 2013", 3 pgs.
"International Application Serial No. PCT/US2012/069201, Written Opinion mailed Mar. 29, 2013", 4 pgs.

* cited by examiner

*Primary Examiner* — Hoai V Pham
(74) *Attorney, Agent, or Firm* — Schwegman, Lundberg & Woessner, P.A.

(57) ABSTRACT

Various embodiments comprise apparatuses having a number of memory cells. In one such apparatus, each cell has a plurality of control gates. For example, each of two control gates is adjacent a respective side of a charge storage structure. In another apparatus, each cell has a control gate and a shield, such as where the control gate is adjacent one side of a charge storage structure and the shield is adjacent another side of the charge storage structure. Additional apparatuses and methods are described.

24 Claims, 8 Drawing Sheets

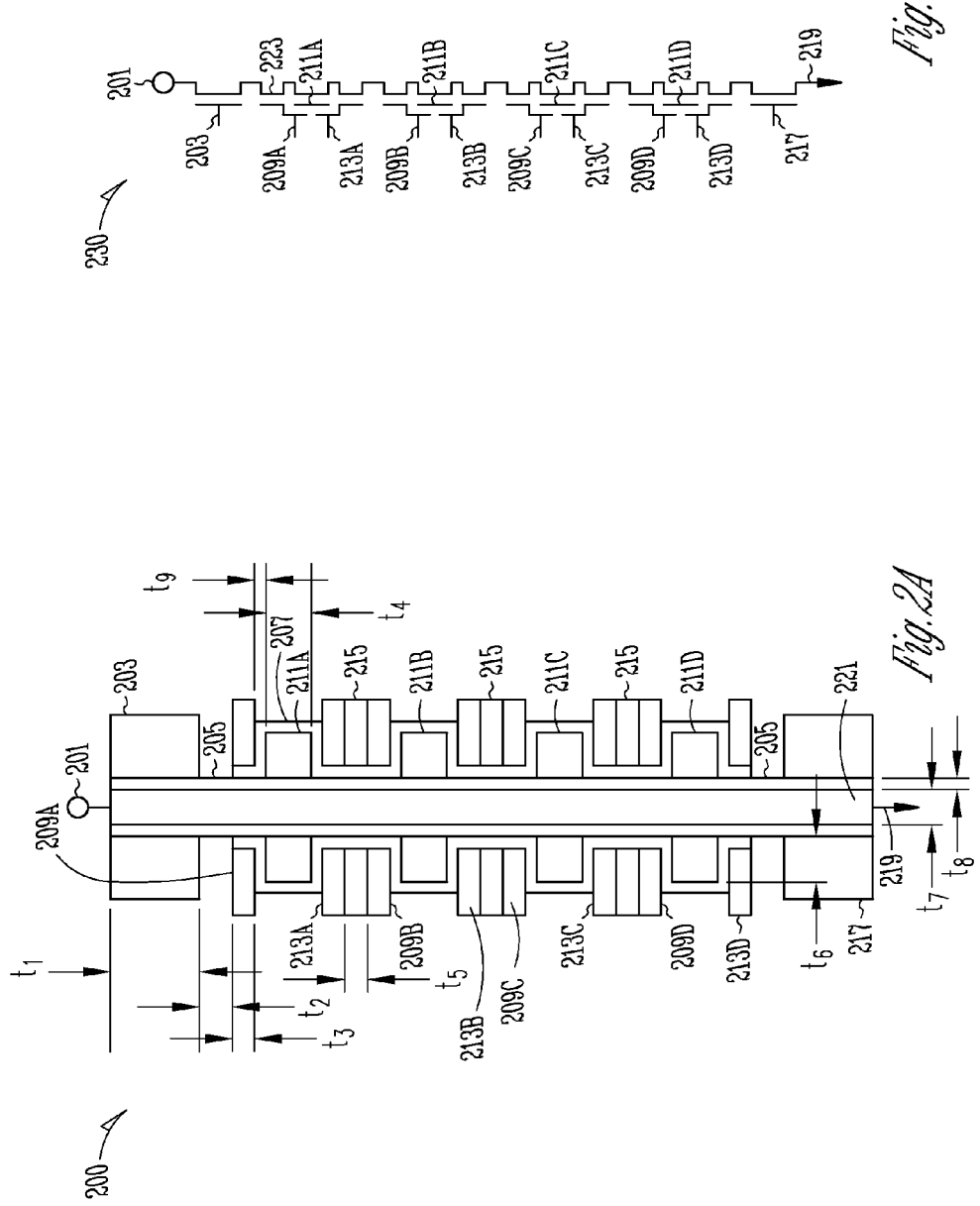

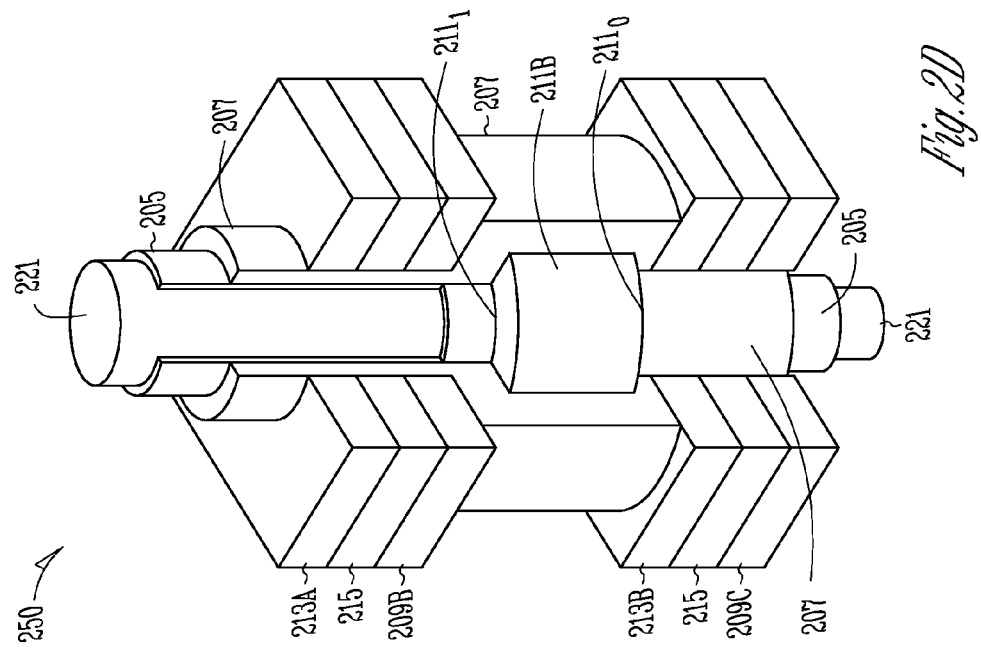
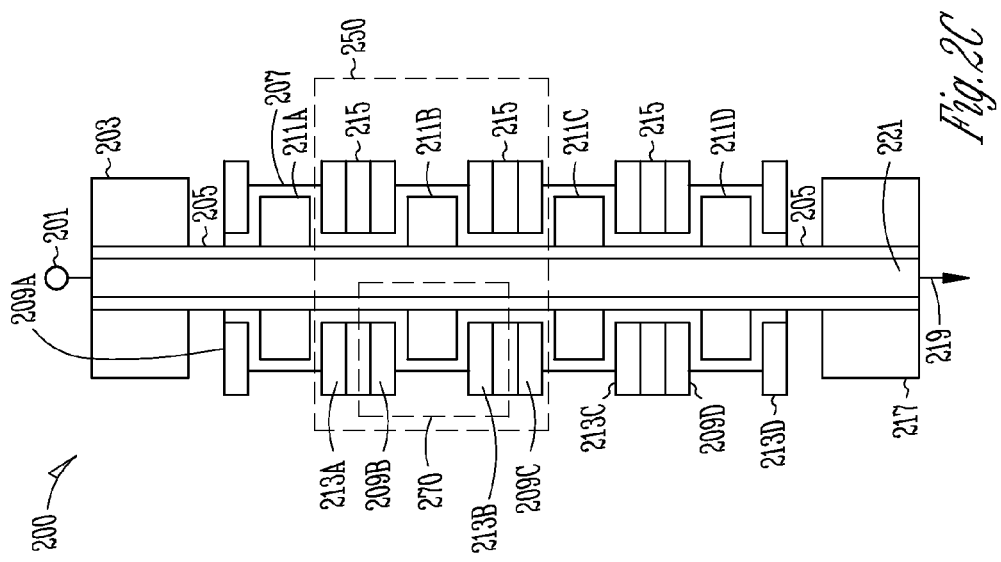
Fig. 2C
Fig. 2D

MEMORY CELLS HAVING A PLURALITY OF CONTROL GATES AND MEMORY CELLS HAVING A CONTROL GATE AND A SHIELD

BACKGROUND

Computers and other electronic systems, for example, digital televisions, digital cameras, and cellular phones, often have one or more memory devices to store information. Increasingly, memory devices are being reduced in size to achieve a higher density of storage capacity. However, correspondingly reduced bias voltages for operations such erasing and programming may result in decreased reliability.

BRIEF DESCRIPTION OF THE DRAWINGS

FIG. 2A shows a cross-sectional schematic representation of a three-dimensional dual control gate memory cell, according to an embodiment;

FIG. 2B shows an equivalent circuit of the three-dimensional dual control gate memory cell of FIG. 2A;

FIG. 2C shows the three-dimensional dual control gate memory cell of FIG. 2A indicating two portions highlighted for additional clarity;

FIG. 2D shows an isometric cut-away representation of a first of the highlighted portions of FIG. 2C;

DETAILED DESCRIPTION

Figure 1:
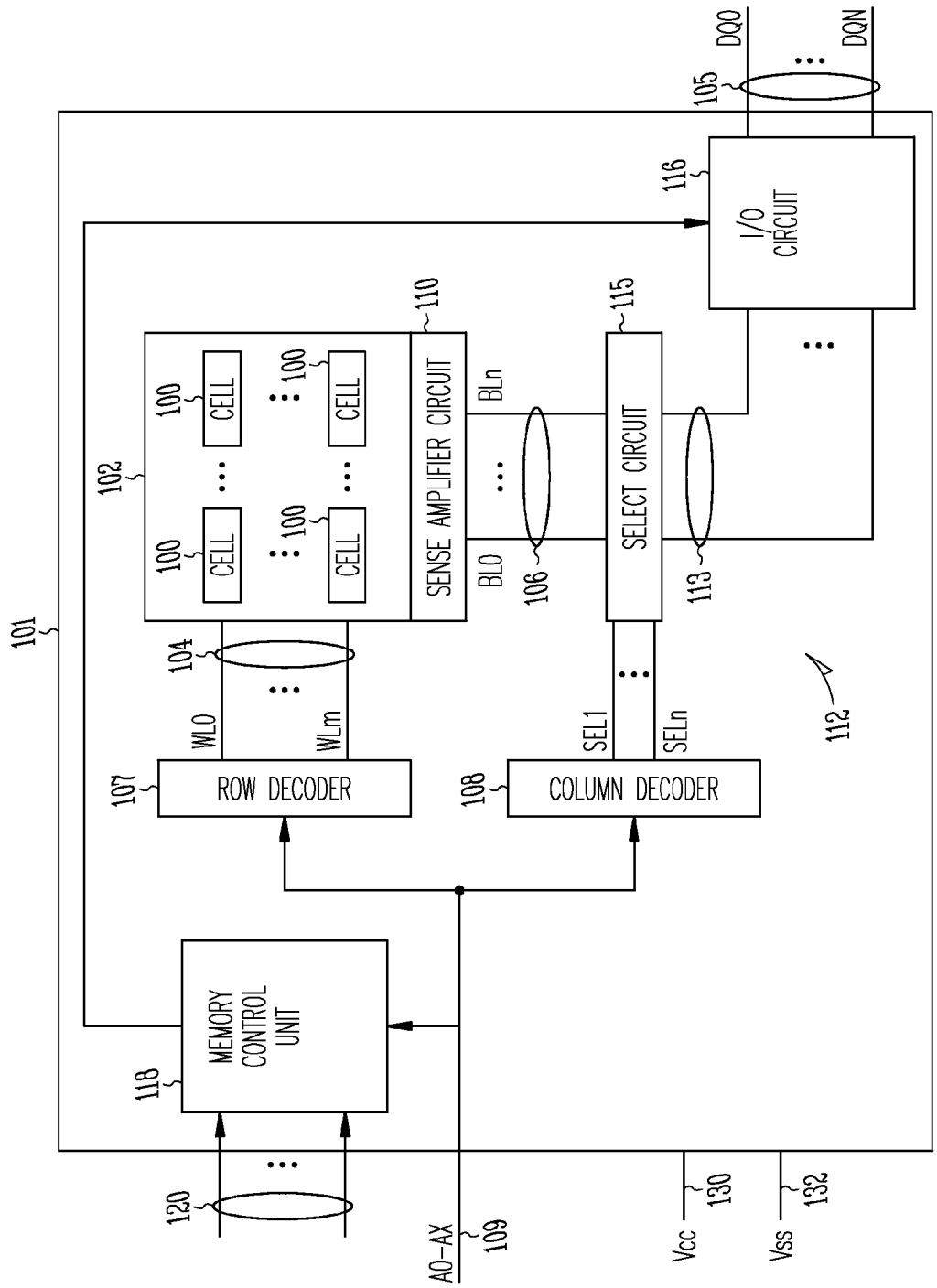
FIG. 1 shows a block diagram of a memory device having a memory array with memory cells, according to an embodiment.

The description that follows includes illustrative apparatuses (circuitry, devices, structures, systems, and the like) and methods (e.g., processes, protocols, sequences, techniques, and technologies) that embody the inventive subject matter. In the following description, for purposes of explanation, numerous specific details are set forth in order to provide an understanding of various embodiments of the inventive subject matter. It will be evident, however, to those skilled in the art that various embodiments of the inventive subject matter may be practiced without these specific details. Further, well-known apparatuses and methods have not been shown in detail so as not to obscure the description of various embodiments.

As used herein, the term "or" may be construed in an inclusive or exclusive sense. Additionally, although various exemplary embodiments discussed below may primarily focus on two-state (e.g., SLC) NAND memory devices, the embodiments are merely given for clarity of disclosure, and thus, are not limited to apparatuses in the form of NAND or NOR memory devices or even to memory devices in general. As an introduction to the subject, a few embodiments will be described briefly and generally in the following paragraphs, and then a more detailed description, with reference to the figures, will ensue.

Various embodiments of methods and apparatuses, including a three-dimensional memory device, are discussed. For example, a three-dimensional memory device is disclosed that comprises a number of memory cells including charge storage structures surrounding respective portions of a pillar of semiconductor material, with each memory cell having dual control gates or each memory cell having a control gate and a shield. A low dielectric constant material can be used to separate adjacent control gates from one another. Thus, control gates are not shared between adjacent memory cells in a string.

In the dual control gate embodiments, for a given cell, a charge storage structure can be positioned substantially between the two control gates without a significant increase in lateral footprint of the memory device. A first dielectric, such as a tunnel oxide, is formed in between the pillar and the charge storage structure while a higher dielectric constant material, such as an inter-polysilicon dielectric (IPD), is added between the control gates and the charge storage structure. Thus, electron charge can be confined to moving between a channel formed in the pillar and the charge storage structure. Tunneling is substantially prevented between the channel and the control gates. The pair of control gates each act on the charge storage structure for program and erase operations.

In an embodiment, a memory device has a high coupling ratio of over 0.5 and a low voltage cell operation (e.g., program voltage of 15 V to 22 V and an erase voltage of −11 V), and a wide program-to-erase (P/E) threshold voltage window of over 2.0V (SLC case). The coupling ratio between the charge storage structure and the control gates of the memory cell should be increased over typical charge storage structure memory cell designs due to the significantly larger surface area between the charge storage structure and the two control gates. Moreover, the memory device should have a negligible charge storage structure-to-charge storage structure interference due to the shielding effect of the dual control gates or a charge storage structure shield for each of the charge storage structures.

In various embodiments, an apparatus (e.g., a memory device or an electronic system including a memory device) is provided that includes a number of memory cells. Each memory cell has a channel material, a charge storage structure, a first dielectric material, a plurality of control gates (e.g., a pair of control gates) and a second dielectric material. The first dielectric material is between the charge storage structure and the channel material. The second dielectric material is between each of the plurality of control gates and the charge storage structure.

In at least some of the embodiments, the channel material is a portion of a pillar of semiconductor material that has a substantially cylindrical cross-section. In some embodiments, the charge storage structure fully surrounds an outer periphery of the channel material.

In various embodiments, an apparatus is provided that includes a number of memory cells. Each memory cell has channel material, a charge storage structure, a first dielectric interposed between the charge storage structure and the channel material; a control gate adjacent a first side of the charge storage structure; a shield adjacent a second side of the charge storage structure; and a second dielectric between the control gate and the charge storage structure.

In some embodiments of the apparatus, at least one of the charge storage structure shields is shared by adjacent unit cells. In some embodiments of the apparatus, adjacent ones of the unit cells are coupled in series forming a string of non-volatile memory cells.

In various embodiments, an apparatus is provided that includes a channel material, a dielectric surrounding an outer periphery of the channel material, and a number of spaced-apart charge storage structures. Each of the number of charge storage structures surrounds a respective portion of the dielectric. The apparatus further includes a number of spaced-apart control gates with each of the number of control gates surrounding a respective portion of the dielectric, and a number of spaced-apart shields with each of the number of shields surrounding a respective portion of the dielectric. In some embodiments of the non-volatile memory device, the channel material has a substantially cylindrical cross-section.

In various embodiments, an apparatus is provided that includes a semiconductor material, a tunnel dielectric surrounding an outer periphery of the semiconductor material, and a number of spaced-apart charge storage structures with each of the number of charge storage structures surrounding a respective portion of the tunnel dielectric. The apparatus further includes a number of spaced-apart pairs of control gates with each of the number of control gates surrounding a respective portion of the tunnel dielectric. Each of the pairs of control gates and a respective one of the charge storage structures comprises a respective memory cell in a string of memory cells.

Referring now to FIG. 1, a block diagram of an apparatus in the form of a memory device 101 is shown. The memory device 101 includes a memory array 102 having a number (e.g., one or more) of memory cells 100 according to an embodiment. The memory cells 100 can be arranged in rows and columns along with access lines 104 (e.g., wordlines to conduct signals WL0 through WLm) and first data lines 106 (e.g., bit lines to conduct signals BL0 through BLn). The memory device 101 can use the access lines 104 and the first data lines 106 to transfer information to and from the memory cells 100. A row decoder 107 and a column decoder 108 decode address signals A0 through AX on address lines 109 to determine which ones of the memory cells 100 are to be accessed.

Sense circuitry, such as a sense amplifier circuit 110, operates to determine the values of information read from the memory cells 100 in the form of signals on the first data lines 106. The sense amplifier circuit 110 can also use the signals on the first data lines 106 to determine the values of information to be written to the memory cells 100.

The memory device 101 is further shown to include circuitry 112 to transfer values of information between the memory array 102 and input/output (I/O) lines 105. Signals DQ0 through DQN on the I/O lines 105 can represent values of information read from or to be written into the memory cells 100. The I/O lines 105 can include nodes within the memory device 101 (or alternatively, pins, solder balls, or other interconnect technologies such as controlled collapse chip connection (C4), or flip chip attach (FCA)) on a package where the memory device 101 resides. Other devices external to the memory device 101 (e.g., a memory controller or a processor, not shown in FIG. 1) can communicate with the memory device 101 through the I/O lines 105, the address lines 109, or the control lines 120.

The memory device 101 can perform memory operations, such as a read operation, to read values of information from selected ones of the memory cells 100 and a programming operation (also referred to as a write operation) to program (e.g., to write) information into selected ones of the memory cells 100. The memory device 101 can also perform a memory erase operation to clear information from some or all of the memory cells 100.

A memory control unit 118 controls memory operations based on signals on the control lines 120. Examples of the signals on the control lines 120 can include one or more clock signals and other signals to indicate which operation (e.g., a programming or read operation) the memory device 101 can or should perform. Other devices external to the memory device 101 (e.g., a processor or a memory controller) can control the values of the control signals on the control lines 120. Specific combinations of values of the signals on the control lines 120 can produce a command (e.g., a programming or read command) that can cause the memory device 101 to perform a corresponding memory operation (e.g., a program, read, or erase operation).

Although various embodiments discussed herein use examples relating to a single-bit memory storage concept for ease in understanding, the inventive subject matter can be applied to numerous multiple-bit schemes as well. For example, each of the memory cells 100 can be programmed to a different one of at least two data states to represent, for example, a value of a fractional bit, the value of a single bit or the value of multiple bits such as two, three, four, or a higher number of bits.

For example, each of the memory cells 100 can be programmed to one of two data states to represent a binary value of "0" or "1" in a single bit. Such a cell is sometimes called a single-level cell (SLC).

In another example, each of the memory cells 100 can be programmed to one of more than two data states to represent a value of, for example, multiple bits, such as one of four possible values "00," "01," "10," and "11" for two bits, one of eight possible values "000," "001," "010," "011," "100," "101," "110," and "111" for three bits, or one of another set of values for larger numbers of multiple bits. A cell that can be programmed to one of more than two data states is sometimes referred to as a multi-level cell (MLC). Various operations on these types of cells are discussed in more detail, below.

The memory device 101 can receive a supply voltage, including supply voltage signals $V_{cc}$ and $V_{ss}$, on a first supply line 130 and a second supply line 132, respectively. Supply voltage signal $V_{ss}$ can, for example, be at a ground potential (e.g., having a value of approximately zero volts). Supply voltage signal $V_{cc}$ can include an external voltage supplied to the memory device 101 from an external power source such as a battery or alternating-current to direct-current (AC-DC) converter circuitry (not shown in FIG. 1).

The circuitry 112 of the memory device 101 is further shown to include a select circuit 115 and an input/output (I/O) circuit 116. The select circuit 115 can respond to signals SEL1 through SELn to select signals on the first data lines 106 and the second data lines 113 that can represent the values of information to be read from or to be programmed into the memory cells 100. The column decoder 108 can selectively activate the SEL1 through SELn signals based on the A0 through AX address signals on the address lines 109. The select circuit 115 can select the signals on the first data lines 106 and the second data lines 113 to provide communication between the memory array 102 and the I/O circuit 116 during read and programming operations.

The memory device 101 may comprise a non-volatile memory device and the memory cells 100 can include non-volatile memory cells such that the memory cells 100 can retain information stored therein when power (e.g., $V_{cc}$, $V_{ss}$, or both) is disconnected from the memory device 101.

Each of the memory cells 100 can include a memory element having material, at least a portion of which can be programmed to a desired data state (e.g., by storing a corresponding amount of charge on a charge storage structure, such as a floating gate or charge trap, or by being programmed to a corresponding resistance value). Different data states can thus represent different values of information programmed into each of the memory cells 100.

The memory device 101 can perform a programming operation when it receives (e.g., from an external processor or a memory controller) a programming command and a value of information to be programmed into one or more selected ones of the memory cells 100. Based on the value of the information, the memory device 101 can program the selected memory cells to appropriate data states to represent the values of the information to be stored therein.

One of ordinary skill in the art may recognize that the memory device 101 may include other components, at least some of which are discussed herein. However, several of these components are not necessarily shown in the figure, so as not to obscure the various embodiments described. The memory device 101 may include devices and memory cells, and operate using memory operations (e.g., programming and erase operations) similar to or identical to those described below with reference to various other figures and embodiments discussed herein.

With reference now to FIG. 2A, a cross-sectional schematic representation of a three-dimensional dual control gate memory device 200 is shown and includes a data line connection 201, a drain select-gate transistor 203, a number of first control gates 209A through 209D, a number of spaced-apart charge storage structures 211A through 211D (e.g., floating gates), and a number of second control gates 213A through 213D. The three-dimensional dual control gate memory device 200 also includes at least a first dielectric (e.g., a tunnel oxide) 205 disposed between a channel material 221 and each of the number of charge storage structures 211A through 211D. As will be better understood with reference to ensuing figures in various embodiments, the channel material 221 may comprise a pillar of semiconductor material (e.g., polysilicon) having a substantially cylindrical cross-section with the first dielectric 205 formed on and surrounding an outer periphery of the channel material 221. In other examples, the channel material may take on other cross-sectional shapes such as substantially square, rectangular, elliptical, or a number of other geometrical profiles. A source line connection 219 couples the channel material 221 to a source line (not shown). An electrical coupling from the channel material 221 to the source line is controlled by a source select-gate transistor 217.

A person of ordinary skill in the art will appreciate that a memory cell string is typically formed from a number of cells coupled together in series. For example, a NAND string may comprise, for example, 8, 16, 32, or any other number of cells between two select gates. However, FIG. 2A is shown to include only four memory cells for illustrative purposes. The person of ordinary skill in the art will understand the inventive subject matter described herein is readily scalable to any number of memory cells. Further, the memory cells can be coupled in series or parallel, or in various other combinations.

With continuing reference to FIG. 2A, each of the first control gates 209A through 209D and the second control gates 213A through 213D are separated from the charge storage structures 211A through 211D by at least a second dielectric material 207. In various embodiments, the second dielectric material 207 can be a high dielectric constant (high-κ) material such as an inter-poly dielectric (IPD) material. Generally, a high dielectric constant material may be considered as any material having a dielectric constant equal or greater than the dielectric constant of silicon dioxide ($SiO_2$). The dielectric constant for $SiO_2$ is approximately 3.9.

The second dielectric material 207 may be a film comprising a single layer material. For example, the single material may be a $SiO_2$ film, tantalum pentoxide ($Ta_2O_5$), silicon nitride ($Si_3N_4$), aluminum oxide ($Al_2O_3$), hafnium oxide ($HfO_2$), or a variety of other dielectric materials. Also, a multilayer film may be used to form the second dielectric material 207 such as, for example, by arranging a silicon dioxide film and a silicon nitride film (e.g., an oxide-nitride-oxide (ONO) film). ONO is a high-dielectric constant material. In other examples, combinations of single layer and multilayer films can be combined.

Adjacent ones of the first control gates 209A through 209D and the second control gates 213A through 213D are separated from one another by at least a third dielectric material 215. In various embodiments, the third dielectric material 215 can be a low dielectric constant (low-κ) material. A low-κ material reduces parasitic capacitances between adjacent ones of the control gates. According to at least one embodiment, a low dielectric constant material may comprise a material having a dielectric constant less than about 3.5. Low-κ materials are known independently to a person of ordinary skill in the art and may include materials such as fluorine-doped silicon dioxide, carbon-doped silicon dioxide, porous silicon dioxide, and various spin-on organic polymer dielectric materials. For example, one carbon-doped silicon dioxide used in the semiconductor industry is known as Black Diamond® 3 material and has a dielectric constant of about 2.2. The Black Diamond® 3 material is produced by Applied Materials, Inc. of Santa Clara, Calif., U.S.A.

In a specific example, the drain select-gate transistor 203 may be deposited or otherwise formed to have a thickness, $t_1$, of about 130 nm. A distance, $t_2$, between the drain select-gate transistor 203 and the first control gate 209A can be about 30 nm. Each of the first control gates 209A through 209D can be formed to a thickness, $t_3$, of about 20 nm. Each of the charge storage structures 211A through 211D can have a thickness, $t_4$, of about 20 nm. A lateral width, $t_6$, of the charge storage structures 211A through 211D can be about 20 nm. A thickness, $t_5$, of the third dielectric material 215 can be about 30 nm. A thickness of the third dielectric material 215 may depend at least partially on the dielectric constant of the material. However, the thickness, $t_5$, may be reduced if a material is selected having a lower dielectric constant. The channel material 221 can have a lateral dimension, $t_7$, of about 40 nm. If the channel material 221 is formed as a cylindrical pillar (discussed below), the diameter of the channel material 221 may be about 40 nm. A thickness, $t_8$, of the first dielectric 205 is about 8 nm. A distance, $t_9$, between each of the first control gates 209A through 209D and an adjacent one of the charge storage structures 211A through 211D can be about 11 nm.

FIG. 2B shows an equivalent circuit 230 of the three-dimensional dual control gate memory device 200 of FIG. 2A. Additionally, a depletion-mode transistor 223 is shown. The bottom side, that is, on the channel material 221 side of the second control gates 209A forms the depletion-mode transistor 223. In various embodiments, each of the individual memory cells may also be based on a depletion-mode transistor. The memory cells may also be based on an enhancement-mode transistor with corresponding changes in various bias voltages and threshold voltages as is independently understood by those of ordinary skill in the art. Various ones of these voltages are discussed in more detail, below.

In the memory cells of FIGS. 2A and 2B, each of the charge storage structures 211A through 211D is controlled by a respective pair of control gates—each pair including a respective one of the first control gates 209A through 209D and a respective one of the second control gates 213A through 213D. Each control gate of the pair of control gates is located on opposite sides of the respective charge storage structure. Consequently, a capacitance between each of the control gates and the respective charge storage structure can be considered as the summation of $C_{CG1-FG}$ and $C_{CG2-FG}$. Thus, assuming the capacitances between each control gate and the respective charge storage structure are approximately equal to one another (that is, $C_{CG1-FG} \approx C_{CG2-FG} \approx C_{CG-FG}$), then the effective capacitance between the control gates and the charge storage structure is the sum of $C_{CG1-FG}$ and $C_{CG2-FG}$, or $2 \cdot C_{CG-FG}$. The sum, $2 \cdot C_{CG-FG}$ is greater than a conventional memory cell. Due to the higher capacitive coupling, the corresponding write voltage, discussed in more detail below, can be less than for a conventional memory cell.

Figure 2E:
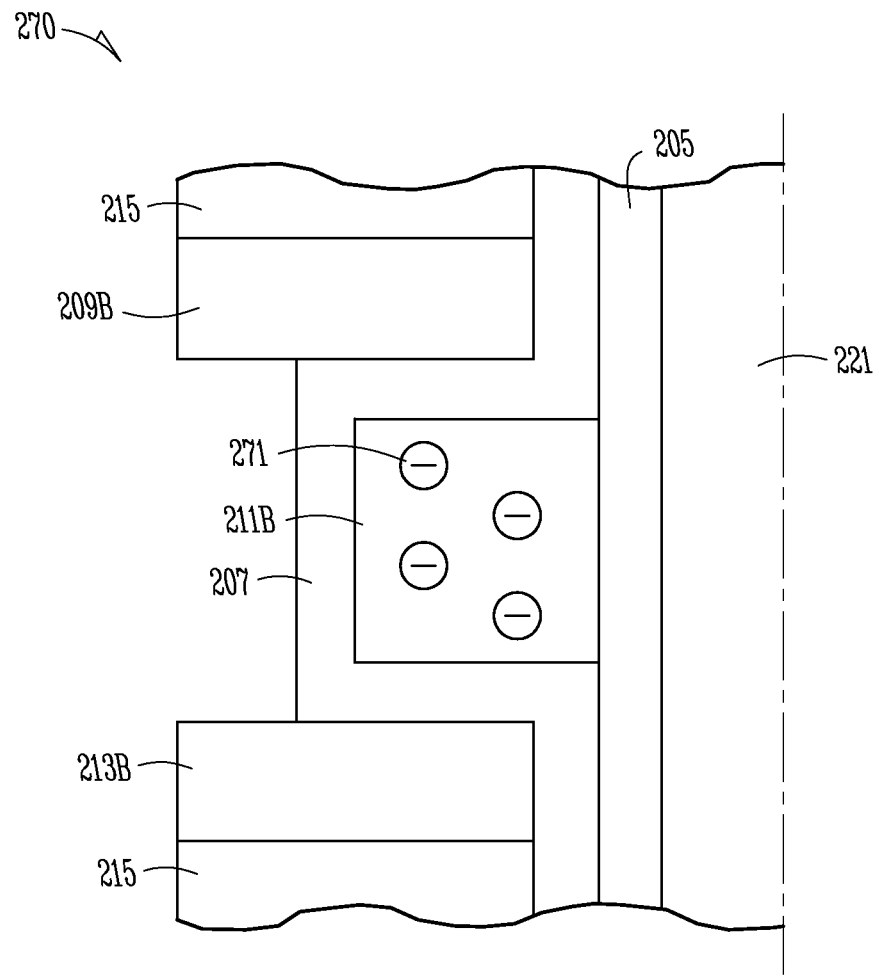
FIG. 2E shows a memory cell of the three-dimensional dual control gate memory cell, according to one of the highlighted portions of FIG. 2C

FIG. 2C shows the three-dimensional dual control gate memory device 200 of FIG. 2A indicating two portions highlighted for additional clarity. A first portion 250 is discussed in more detail with reference to FIG. 2D, below. A second portion 270 is discussed in more detail with reference to FIG. 2E, below. A memory cell of the three-dimensional dual control gate memory device 200 comprises one of the charge storage structures 211A through 211D disposed between one of the first control gates 209A through 209D and one of the second control gates 213A through 213D.

FIG. 2D shows an isometric cut-away representation of the first portion 250 of FIG. 2C. Each of the labeled elements are similar to the components discussed with reference to FIG. 2A, above. The charge storage structure 211B is shown as a substantially-toroidal structure (i.e., a toroid) surrounding the channel material 221 and the first dielectric 205. However, each of the number of charge storage structures 211A through 211D can be formed in a variety of shapes. Additionally, although the first portion 250 shows a substantially toroidally-shaped version of the charge storage structure 211B, a person of ordinary skill in the art can readily adapt formation processes to a number of feature types upon reading and understanding the disclosure and figures provided herein. For example, the charge storage structures can take on a number of different shapes and geometries including substantially square, substantially rectangular, and substantially stadium-like (i.e., a geometrical form) structures. Each of these geometries has an inner surface $211_i$ in contact with the first dielectric 205 (e.g., to allow Fowler-Nordheim tunneling of electrons into the charge storage structure 211B), and also an outer surface $211_o$.

FIG. 2E shows a memory cell of the three-dimensional dual control gate memory device 200, according to the second portion 270 of FIG. 2C. The second portion 270 indicates half of a memory cell. Since the memory cell may be symmetrical about the channel 221 material, only one-half of the memory cell is discussed. A person of ordinary skill in the art can readily envision how the three-dimensional dual control gate memory device 200 can function based on this representation, and the description that follows.

Consider an accumulated charge 271, present on the charge storage structure 211B. The charge 271 has been accumulated through a programming operation by applying a sufficient positive voltage to the first control gate 209B and the second control gate 213B such that the channel 221 is turned on so that electrons can flow from the source end to the drain end of the memory cell (assuming an NMOS-type device).

Electrons forming the charge 271 shift a required threshold voltage, $V_{th}$, to be increasingly positive. The threshold voltage affects source-to-drain current of the memory cell. As electrons are added to increase the charge 271 on the charge storage structure 211B, the threshold voltage required for the memory cell to conduct also increases. Various charge spreading problems of the prior art, (e.g., as is found in SONOS devices) should be eliminated since the charge 271 is confined to the charge storage structure 211B located between first control gate 209B and the second control gate 213B.

When writing data to one of the memory cells, a particular gate potential can be applied to the drain select-gate transistor 203 at the data line side of the memory string. A voltage (e.g., a ground voltage) can be supplied to the data line, with a sufficiently higher voltage, relative to that on the data line, applied to the gate of the drain select-gate transistor 203, so that current is conducted. The voltage on the data line can then be transferred to the channel of the selected cell sufficient to allow a write operation to be carried out. A write potential, $V_{pgm}$, can be applied to the access line corresponding to the memory cell to be written. A potential $V_{pass}$ can be concurrently applied to non-selected access lines WL.

As discussed above, charge storage structures may be controlled by a pair of control gates. Thus, a charge storage structure can be selected for various operations by the activity of pairs of control gates. For example, a selected charge storage structure can be controlled by a respective pair of control gates. Thus, for a write operation, the same write voltage, $V_{pgm}$, may be applied to the pair of respective control gates arranged adjacent to the charge storage structure being programmed. The channel 221 may be held at 0 V during such activity.

For instance, Table 1 shows examples of voltage levels for performing various operations on the charge storage structure 211B of the three-dimensional dual control gate memory device 200. For example, an erase voltage, $V_{erase}$, of −11 V can be applied to each of the control gates while the select gates 203, 217 have an applied gate voltage, $V_{passE}$, of 4.5 V. The data line and the source line are each maintained at 0 V.

To program the charge storage structure 211B, a program voltage, $V_{pgm}$, of 15 V can be applied to control gates adjacent the charge storage structure 211B. That is, $V_{pgm}$ can be applied to the first control gate 209B and the second control gate 213B. For charge storage structures of the string of memory cells that are not being programmed, a pass voltage, $V_{pass2}$ or $V_{pass1}$, of 2 V or 4 V, respectively, can be applied to control gates adjacent the other charge storage structures. One purpose of $V_{pass2}$ of 2 V is for splitting the channel locally so as to increase the inhibiting voltage more effectively. This scheme is sometimes referred to as Local Self Boosting (LSB). And the other split channels which are both bitline and source line sides are also boosted such that the leakage current from the inhibiting channel may be suppressed by using the back-gate bias effect. A bias voltage, $V_{passP}$, can be applied to the drain select-gate transistor 203 and 0 V can be applied to the source select-gate transistor 217. The data line and source line can both be held at $V_{cc}$ in order to suppress the leakage current from the inhibiting channel by utilizing the back-bias effect of the source select-gate transistor 217.

During a read operation of the charge storage structure 211B, 0 V can be applied to the control gates 209B, 213B adjacent the charge storage structure 211B while a read voltage, $V_{read}$, of 4 V can be applied to the remaining control gates, as indicated. ($V_{read}$ is selected as 4 V in this example but other bias voltage levels may be applied provided $V_{read}$ is selected to be higher than $V_{cc}$. In this example, $V_{cc}$ is assumed but be 3.3 V.) Consequently, with a bias voltage, $V_{read}$, of 4 V applied to the control gates of each of the other memory cells of the string, each of the other memory cells of the string, except for the selected cell to be read, serve as pass gates. In an example where a logic value of "1" was written to the charge storage structure 211B of the selected memory cell, the memory cell is in depletion mode and current flows even with 0 V applied to the control gates 209B, 213B. Conversely, if the charge storage structure 211B was programmed with a logic value of "0," current does not flow through the memory cell since the cell is operating in the enhancement mode. Therefore, during a read operation, the state of the selected memory cell is detected by a sense amplifier, which is coupled with the data line. The difference between 0 and 1, in this example, is determined by whether negative charge is stored in the charge storage structure 211B (see FIG. 2E). If negative charge is stored in the structure, the threshold voltage becomes higher and memory cell is operating in the enhancement mode. The voltages shown in Table 1 are provided as an example only and can vary depending upon particular materials and dimensions used to fabricate the three-dimensional dual control gate memory device 200 (FIG. 2A).

TABLE 1

Programming of a Selected Charge Storage Structure

| ELECTRODE (ELEMENT NUMBER) | ERASE VOLTAGE | PROGRAM VOLTAGE | READ VOLTAGE |
|---|---|---|---|
| BL | 0 V | $V_{cc}$ | $V_{bl}$: 1 V |
| SGD (203) | $V_{passE}$: 4.5 V | $V_{passP}$: 4.5 V | $V_{passR}$: 4.5 V |
| CG3$_{top}$ (209A) | $V_{erase}$: -11 V | $V_{pass2}$: 2 V | $V_{read}$: 4 V |
| CG3$_{bottom}$ (213A) | $V_{erase}$: -11 V | $V_{pass2}$: 2 V | $V_{read}$: 4 V |
| CG2$_{top}$ (209B) | $V_{erase}$: -11 V | $V_{pgm}$: 15 V | 0 V |
| CG2$_{bottom}$ (213B) | $V_{erase}$: -11 V | $V_{pgm}$: 15 V | 0 V |
| CG1$_{top}$ (209C) | $V_{erase}$: -11 V | $V_{pass2}$: 2 V | $V_{read}$: 4 V |
| CG1$_{bottom}$ (213C) | $V_{erase}$: -11 V | $V_{pass2}$: 2 V | $V_{read}$: 4 V |
| CG0$_{top}$ (209D) | $V_{erase}$: -11 V | $V_{pass1}$: 4 V | $V_{read}$: 4 V |
| CG0$_{bottom}$ (213D) | $V_{erase}$: -11 V | $V_{pass1}$: 4 V | $V_{read}$: 4 V |
| SGS (217) | $V_{passE}$: 4.5 V | 0 V | $V_{passR}$: 4.5 V |
| CSL (219) | 0 V | $V_{cc}$ | 0 V |

In comparison with previous attempts that share control gates between adjacent memory cells to conserve space, voltage levels discussed herein can be reduced by about one-half, since the bias on adjacent control gates does not need to be overcome to perform an operation on one charge storage structure.

Some prior art memory cells use a single control gate to span, and thus control, two charge storage structures. For example, three memory cells connected in series may have their respective charge storage structures, FG1, FG2, and FG3, controlled by four control gates, CG0, CG1, CG2, and CG3. Thus, FG1 is controlled by CG0 and CG1, FG2 is controlled by CG1 and CG2, and FG3 is controlled by CG2 and CG3. To select FG2 for reading, a voltage, $V_{read}$, of 0 V is applied to the control gates CG1 and CG2. Consequently, alternate ones of the control gates, that is CG1 and CG4, must be higher than $V_{read}$ to turn on FG1 and FG3. Thus, if $V_{read}$ is 4 V, then alternating ones of the control gates must be at 2×$V_{read}$, or 8 V when FG1 is selected for reading or programming. Therefore, a higher read voltage must be applied to particular control gates in these prior art memory cells.

With reference again to FIG. 2B, in contrast to various forms of the prior art, when, for example, the charge storage structure 211B is selected to be read, the first control gate 209B and the second control gate 213B can be at 0 V. Neighboring control gates, that is, the first control gate 209C and the second control gate 213A, can be at, for example 2×$V_{read}$ or at 0 V, alternately, such that unselected ones of the charge storage structures in the same block can be turned on.

Table 2, below, shows example voltage levels for hot-hole erasure, where the voltage of the channel 221 is boosting by the gate-induced leakage current (GIDL) of the CSL of $V_{erase}$, and re-programming of the charge storage structure 211B. As will be readily recognizable by a person of ordinary skill in the art, various subscripts in Table 2 relate to various operations and corresponding voltages applied to gates of the various transistors. For example, "erase" refers to erase voltages, "read" applies to read voltages, and "pass" refers to the various transistors acting as pass transistors.

TABLE 2

Higher Re-Programming Voltage of a Selected Charge Storage Structure

| ELECTRODE (ELEMENT NUMBER) | ERASE VOLTAGE | PROGRAM VOLTAGE | READ VOLTAGE |
|---|---|---|---|
| BL | $V_{erase}$: 18-22 V | $V_{cc}$ | $V_{bl}$: 1 V |
| SGD (203) | Floating | $V_{passP}$: 4.5 V | $V_{passR}$: 4.5 V |
| CG3$_{top}$ (209A) | 0 V | $V_{pass2}$: 2 V | $V_{read}$: 6 V |
| CG3$_{bottom}$ (213A) | 0 V | $V_{pass2}$: 2 V | $V_{read}$: 6 V |
| CG2$_{top}$ (209B) | 0 V | $V_{pgm}$: 18-22 V | 0 V |
| CG2$_{bottom}$ (213B) | 0 V | $V_{pgm}$: 18-22 V | 0 V |
| CG1$_{top}$ (209C) | 0 V | $V_{pass2}$: 2 V | $V_{read}$: 6 V |
| CG1$_{bottom}$ (213C) | 0 V | $V_{pass2}$: 2 V | $V_{read}$: 6 V |
| CG0$_{top}$ (209D) | 0 V | $V_{pass1}$: 6 V | $V_{read}$: 6 V |
| CG0$_{bottom}$ (213D) | 0 V | $V_{pass1}$: 6 V | $V_{read}$: 6 V |
| SGS (217) | Floating | 0 V | $V_{passR}$: 4.5 V |
| CSL (219) | $V_{erase}$: 18-22 V | $V_{cc}$ | 0 V |

Figure 3:
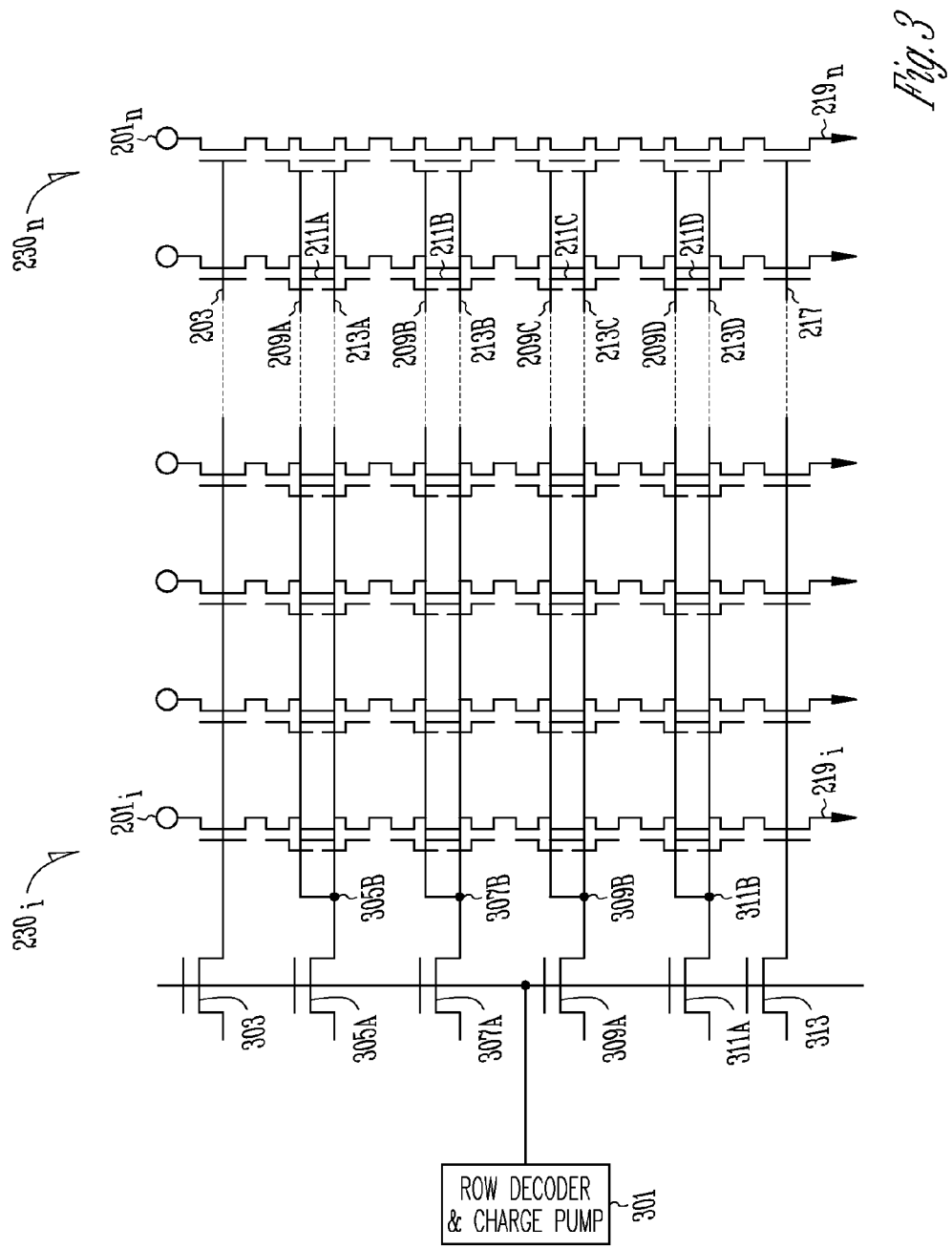
FIG. 3 shows a schematic of a memory cell array with upper and lower control gates from a memory cell connected to a series of control gate driver transistors.

FIG. 3 shows a schematic of a NAND-type memory cell array connected to a series of control gate driver transistors. FIG. 3 includes a row decoder and charge pump 301, a drain select drive-transistor 303, a source select drive-transistor 313, and a number of control gate drive-transistors 305A, 307A, 309A, 311A. The row decoder and charge pump 301 can be coupled to each of the drain select drive-transistor 303, the source select gate drive-transistor 313, and the number of control gate drive-transistors 305A, 307A, 309A, and 311A by a separate electrical interconnect to each (not shown so as not to obscure other details in the drawing.)

Each of the control gate drive transistors is electrically coupled with a respective node 305B, 307B, 309B, 311B to drive respective pairs of the control gates concurrently. For example, when selected, the control gate drive-transistor 305A provides current to a first node 305B to drive the first control gate 209A and the second control gate 213A in each of the strings 230$_i$ through 230$_n$. Each of the strings of memory cells is formed by connecting adjacent ones of the memory cells in series between the select gates. The row decoder and charge pump 301, the drain select drive-transistor 303, the source select gate drive-transistor 313, and the number of control gate drive-transistors 305A, 307A, 309A, 311A can each be electrically coupled with a number of individual ones of the strings 230$_i$ through 230$_n$ through a number of interconnects.

Subsets of cells coupled to a chosen access line can be programmed or sensed together as a group. A programming operation, for example, a write operation, can include applying a number of program bias voltages, as discussed above, to a chosen access line in order to increase the threshold voltage, $V_t$, of chosen cells to a desired program voltage level corresponding to a desired data state.

A sensing operation, such as a read or program verify operation, can include sensing a voltage or current change of a data line coupled to a selected cell in order to determine the state of the selected cell. The sensing operation can involve biasing a data line associated with a chosen memory cell at a voltage above a bias voltage for a source line associated with the selected memory cell. A sensing operation could alternatively include pre-charging the data line followed with discharge when a selected cell begins to conduct, and then sensing the discharge.

Sensing the state of a selected cell can include applying a sensing voltage to a selected data line while biasing the unselected cells of the string at a voltage sufficient to place the unselected cells of the string in a conducting state independent of the threshold voltage of the unselected cells, as discussed above. The data line corresponding to the selected cell being read or verified can be sensed to determine whether or not the selected cell conducts in response to the particular sensing voltage applied to the selected access line. For example, the state of a selected cell can be determined by the access line voltage at which the data line current reaches a particular reference current associated with a particular state.

Figure 4:
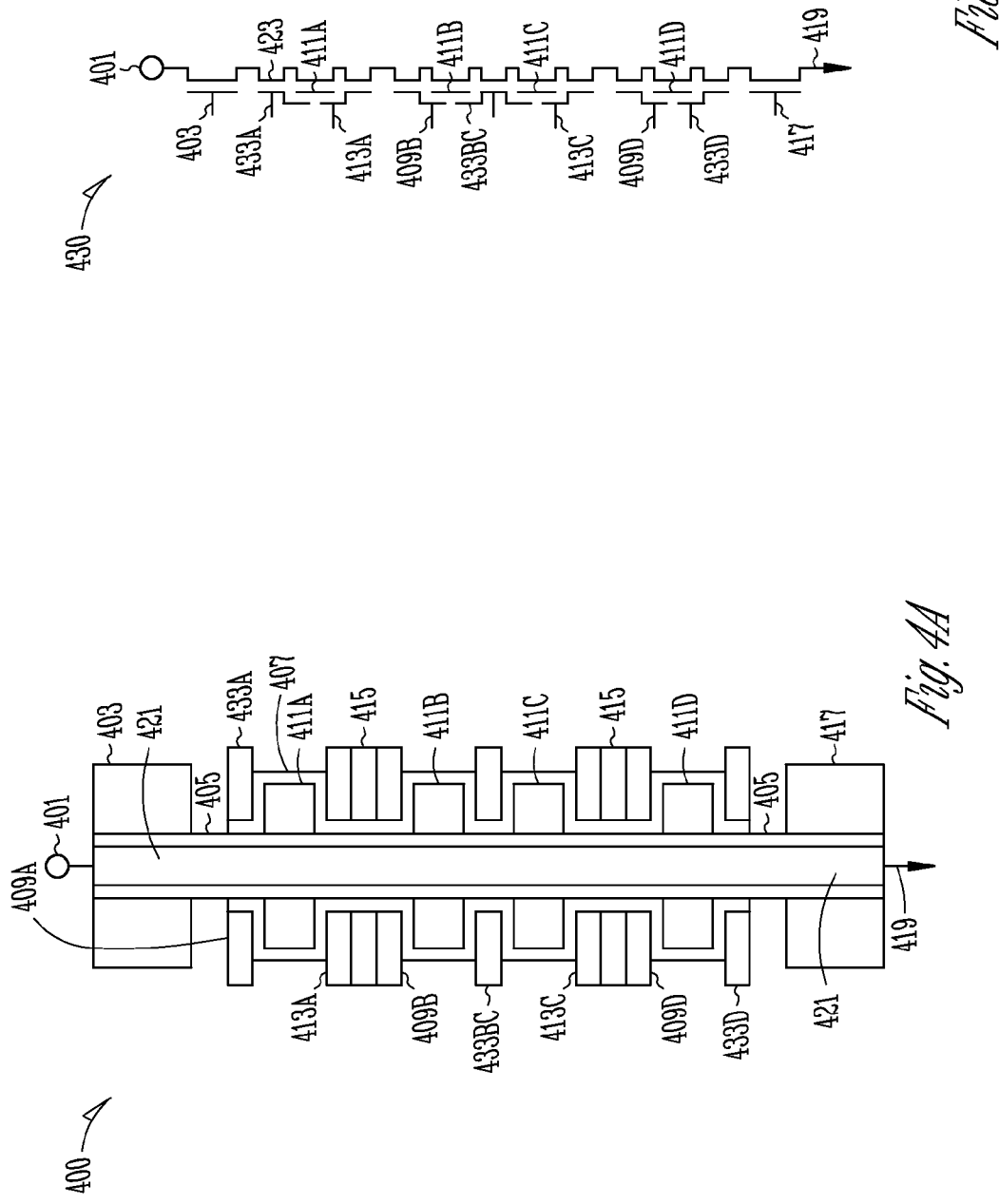
FIG. 4A shows a cross-sectional schematic representation of a three-dimensional control gate memory cell having a charge storage structure shield, according to an embodiment.
FIG. 4B shows an equivalent circuit of the three-dimensional control gate memory cell of FIG. 4A.

FIG. 4A shows a cross-sectional schematic representation of a three-dimensional control gate memory device 400 having a number of charge storage structure shields 433A, 433BC, 433D. As explained in more detail below, the charge storage structure shields 433A, 433BC, 433D can reduce capacitive coupling of control gates in adjacent memory cells to a charge storage structure in a first memory cell. Although the three-dimensional control gate memory device 400 may be similar in some ways as the memory device 200 of FIG. 2A, a memory cell of the memory device 400 of FIG. 4A comprises a charge storage structure disposed between a control gate and a charge storage structure shield. However, similar to the memory device 200 of FIG. 2A, the control gate is not in common, that is, is not shared, by adjacent memory cells. By eliminating the redundant control gate and sharing a charge storage structure shield between adjacent ones of the memory cells (discussed below), the memory device 400 lowers the total string length since it uses only one control gate per memory cell while still maintaining various benefits discussed above with reference to, for example, FIGS. 2A through 2D.

With continuing reference to FIG. 4A, the three-dimensional control gate memory device 400 includes a data line connection 401, a drain select-gate transistor 403, and a number of control gates 409B, 409D, 413A, 413C. Thus, each of the charge storage structures 411A through 411D has only one associated control gate. For example, the charge storage structure 411A closest to the drain select-gate transistor 403 has an associated control gate 413A. The structure disposed between the charge storage structure 411A and the drain select-gate transistor 403 is a charge storage structure shield 433A. The depicted three-dimensional control gate memory device 400 also has two additional charge storage structure shields: a charge storage structure shield 433BC associated with both the charge storage structure 411B above the shield and a charge storage structure 411C located beneath the shield, as well as a charge storage structure shield 433D associated with the charge storage structure 411D. When a bias voltage is applied to the charge storage structure shield 433BC, the charge storage structure shield 433BC can reduce capacitive coupling effects between adjacent ones of the charge storage structure 411B, 411C, and also reduce capacitive coupling effects from, for example, the control gate 409B to the charge storage structure 411C. The charge storage structure 411D located nearest to the source select-gate transistor 417 has an associated charge storage structure shield 433D. Each of the charge storage structure shields may have a bias voltage applied, as discussed below. However, since certain ones of the charge storage structure shields may be shared with certain ones of the charge storage structures, the overall length of the memory cell is reduced as compared with the memory device 200 of FIG. 2A.

As with the memory device 200, the memory device 400 of FIG. 4A also includes at least a first dielectric 405 disposed between a channel material 421 and each of the number of charge storage structures 411A through 411D. Each of the number of spaced-apart charge storage structures 411A through 411D surrounds a respective portion of the first dielectric 405. Many of the materials and dimensions discussed above with reference to FIG. 2A may be applied to the structure of FIG. 4A as well. For example, the channel material 421 may comprise a substantially cylindrically-shaped pillar of semiconductor material (e.g., polysilicon) with the first dielectric 405 formed on and around an outer periphery of the channel material 421. A source line connection 419 couples the channel 421 to a source line (not shown). An electrical coupling from the channel 421 to the source line is controlled by the source select-gate transistor 417.

With continuing reference to FIG. 4A, each of the control gates 409B, 409D, 413A, 413C is separated from a respective one of the charge storage structures 411A through 411D by at least a second dielectric material 407. In various embodiments, the second dielectric material 407 can be a high dielectric constant (high-κ) material such as the inter-poly dielectric (IPD) as discussed above with reference to FIG. 2A.

Adjacent control gates, such as the control gates 413A, 409B, are separated from one another by at least a third dielectric material 415. In various embodiments, the third dielectric material 415 can be a low dielectric constant (low-κ) material, similar to that described above with reference to the third dielectric material 215 of FIG. 2A. The low-κ material reduces parasitic capacitances between adjacent ones of the control gates.

FIG. 4B shows an equivalent circuit 430 of the three-dimensional control gate memory device 400 of FIG. 4A. Additionally, a depletion-mode transistor 423 is shown. The bottom side, that is, the channel material 421 side of the charge storage structure shield 433A forms the depletion-mode transistor 423. In various embodiments, each of the individual memory cells may also be based on a depletion-mode transistor. The memory cells may also be based on an enhancement-mode transistor, with corresponding changes in various bias voltages and threshold voltages as is independently understood by those of ordinary skill in the art.

Table 3 shows examples of voltage levels for performing various operations on the charge storage structure 411B of the three-dimensional control gate memory device 400. For example, an erase voltage, $V_{erase}$, of −11 V can be applied to each of the control gates while the select gates 403, 417 have a gate voltage, $V_{passE}$, of 4.5 V. The data line and the source line can each be maintained at 0 V.

To program the charge storage structure 411B, a program voltage, $V_{pgm}$, of 15 V can be applied to the control gate 409B and a bias voltage, $V_{pass2}$, of 2 V applied to the charge storage structure shield 433BC, the control gate 409B being adjacent a first side of the charge storage structure 411B and the charge storage structure shield 433BC being adjacent a second side of the charge storage structure 411B. For charge storage structures of memory cells in the string not being programmed, a pass voltage, $V_{pass2}$ or $V_{pass1}$, of 2 V or 4 V, respectively, can be applied as indicated to their respective control gates and charge storage structure shields. A bias voltage, $V_{passP}$, can be applied to the drain select-gate transistor 403 and 0 V can be applied to the source select-gate transistor 417. The data line and source line can each be at $V_{cc}$.

During a read operation of the charge storage structure 411B, 0 V can be applied to the control gate 409B and the charge storage structure shield 433BC, each being adjacent a respective side of the charge storage structure 411B, while applying a read voltage, $V_{read}$, of 4 V to the remaining control gates and charge storage structure shields of the string, as indicated. ($V_{read}$ is selected as 4 V in this example but other bias levels may be applied provided $V_{read}$ is selected to be higher than $V_{cc}$. In this example, $V_{cc}$ is assumed but be 3.3 V.) Consequently, with a bias voltage, $V_{read}$, of 4 V applied to the control gates and the charge storage structure shields of each of the other memory cells of the string, each of the other memory cells, except for the selected cell to be read, serve as pass gates. In an example where a logic value of "1" was written to the charge storage structure 411B of the selected memory cell, the memory cell is operating in depletion mode and current flows even with 0 V applied to the control gate 409B. Conversely, if the charge storage structure 411B was programmed with a logic value of "0," current does not flow through the memory cell since the cell is operating in the enhancement mode. Therefore, during a read operation, a state of the selected memory cell is detected by a sense amplifier, which is coupled with the data line. The difference between "0" and "1," in this example, can be determined by whether negative charge is stored in the charge storage structure 411B (see FIG. 2E). If negative charge is stored in the charge storage structure, the threshold voltage becomes higher and the memory cell is operating in the enhancement mode. The voltages shown in Table 3 are provided as an example only and can vary depending upon particular materials and dimensions used to fabricate the three-dimensional control gate memory device 400 (FIG. 4A).

TABLE 3

Programming of a Selected Charge Storage Structure

| ELECTRODE (ELEMENT NUMBER) | ERASE VOLTAGE | PROGRAM VOLTAGE | READ VOLTAGE |
| --- | --- | --- | --- |
| BL | 0 V | $V_{cc}$ | $V_{bl}$: 1 V |
| SGD (403) | $V_{passE}$: 4.5 V | $V_{passP}$: 4.5 V | $V_{passR}$: 4.5 V |
| CSSS3 (433A) | $V_{erase}$: −11 V | $V_{pass2}$: 2 V | $V_{read}$: 4 V |
| CG3 (413A) | $V_{erase}$: −11 V | $V_{pass2}$: 2 V | $V_{read}$: 4 V |
| CG2 (409B) | $V_{erase}$: −11 V | $V_{pgm}$: 15 V | 0 V |
| CSSS12 (433BC) | $V_{erase}$: −11 V | $V_{pass2}$: 2 V | $V_{read}$: 4 V |
| CG1 (413C) | $V_{erase}$: −11 V | $V_{pass2}$: 4 V | $V_{read}$: 4 V |
| CG0 (409D) | $V_{erase}$: −11 V | $V_{pass2}$: 4 V | $V_{read}$: 4 V |
| CSSSS0 (433D) | $V_{erase}$: −11 V | $V_{pass2}$: 4 V | $V_{read}$: 4 V |
| SGS (417) | $V_{passE}$: 4.5 V | 0 V | $V_{passR}$: 4.5 V |
| CSL | 0 V | $V_{cc}$ | 0 V |

Table 4, below, shows example voltage levels for re-programming of the charge storage structure 411B. As will be readily recognizable by a person of ordinary skill in the art, various subscripts in Table 4 relate to various operations and corresponding voltages applied to gates of the various transistors. For example, "erase" refers to erase voltages, "read" applies to read voltages, and "pass" refers to the various transistors acting as pass transistors.

TABLE 4

Higher Re-Programming Voltage of a Selected Charge Storage Structure

| ELECTRODE (ELEMENT NUMBER) | ERASE VOLTAGE | PROGRAM VOLTAGE | READ VOLTAGE |
| --- | --- | --- | --- |
| BL | $V_{erase}$: 18-22 V | $V_{cc}$ | $V_{bl}$: 1 V |
| SGD (403) | Floating | $V_{passP}$: 4.5 V | $V_{passR}$: 4.5 V |
| CSSS3 (433A) | 0 V | $V_{pass2}$: 2 V | $V_{read}$: 6 V |
| CG3 (413A) | 0 V | $V_{pass2}$: 2 V | $V_{read}$: 6 V |
| CG2 (409B) | 0 V | $V_{pgm}$: 18-22 V | 0 V |
| CSSS12 (433BC) | 0 V | $V_{pass2}$: 2 V | $V_{passR}$: 4.5 V |
| CG1 (413C) | 0 V | $V_{pass2}$: 2 V | $V_{read}$: 6 V |
| CG0 (409D) | 0 V | $V_{pass2}$: 6 V | $V_{read}$: 6 V |
| CSSS0 (433D) | 0 V | $V_{pass1}$: 6 V | $V_{read}$: 6 V |
| SGS (417) | 0 V | $V_{pass1}$: 6 V | $V_{read}$: 6 V |
| CSL | Floating | 0 V | $V_{passR}$: 4.5 V |
| BL | $V_{erase}$: 18-22 V | $V_{cc}$ | 0 V |

A problem that can arise when memory device size is reduced is that the gate coupling ratio (GCR) may decrease. To scale a device, the surface area of the control gate and the charge storage structure is often reduced when the overall size of the device is reduced. The GCR is a function of the surface area of the two structures and is therefore decreased as the surface area decreases. Typically, in order to overcome the reduced GCR, transistors adjacent to or in the same string as a particular memory cell must operate at higher voltage levels, as discussed above with reference to Table 1. However, if the reduction in GCR is large enough, the transistors may be forced to operate near breakdown levels.

Figure 5:
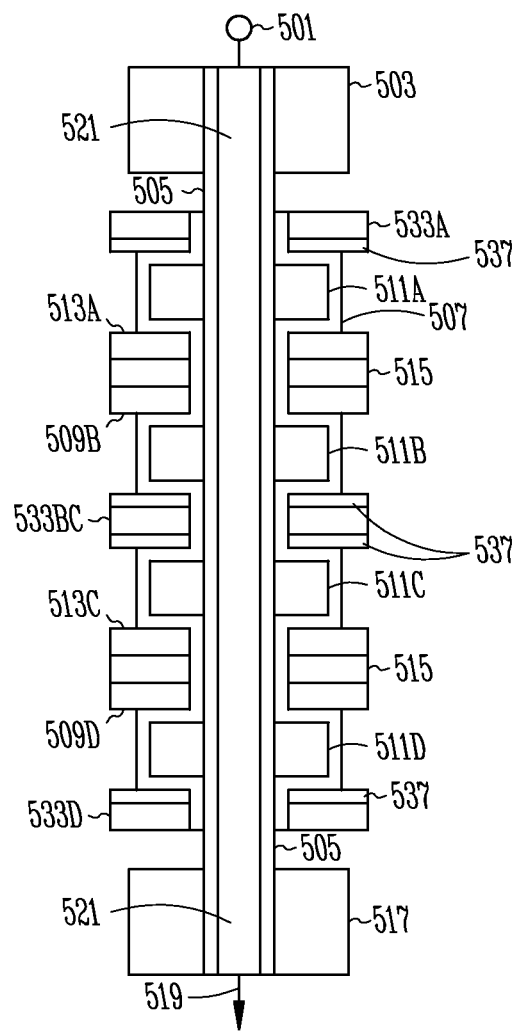
FIG. 5 shows a cross-sectional schematic representation of a three-dimensional control gate memory cell having an increased gate coupling ratio, according to an embodiment.

FIG. 5 shows a cross-sectional schematic representation of a three-dimensional control gate memory cell having an increased gate coupling ratio, according to an embodiment. The memory device includes a data line connection 501, a drain select-gate transistor 503, a number of control gates 509B, 509D, 513A, 513C, a first dielectric 505, a channel material 521, a second dielectric material 507, and a third dielectric material 515. The memory device further includes a number of spaced-apart charge storage structure shields 533A, 533BC, 533D and a number of spaced-apart charge storage structures 511A through 511D. Thus, each of the charge storage structures 511A through 511D has only one associated control gate. For example, the charge storage structure 511A closest to the drain select-gate transistor 503 has an associated control gate 513A. Each of these various components may be similar to and comprised of the same materials as similar components in the memory device 400 of FIG. 4A.

However, although the three-dimensional control gate memory device may be similar in some ways to the memory device 400 of FIG. 4A (e.g., a memory cell of the memory device of FIG. 5 comprises a charge storage structure disposed between a control gate and a charge storage structure shield), each of the memory cells in the embodiment depicted in FIG. 5 has at least a fourth dielectric material 537 disposed between the charge storage structure shield 533 of the cell and the charge storage structure 511 of the cell. The fourth dielectric material 537 may be a low-κ dielectric material.

For example, the fourth dielectric material 537 may be disposed on either side of a charge storage structure shield 533BC, such that the fourth dielectric material 537 is disposed between the charge storage structure shield 533BC, and the charge storage structure 511G, as well as between the charge storage structure shields 533BC and the adjacent charge storage structure 511C.

By disposing the fourth dielectric material 537 between a charge storage structure shield and a proximate charge storage structure, the GCR can be increased. The increase in GCR is due to the control gate being more dominantly coupled to a given charge storage structure due to the fourth dielectric material 537. For example, the control gates 509B, 513C are each coupled more dominantly to their respective charge storage structures 511B, 511C due to the fourth dielectric material 537 on either side of the charge storage structure shield 533BC. Similarly, the control gates 513A, 509D are more dominantly coupled to their respective charge storage structures 511A, 511D due to the fourth dielectric material 537 on the charge storage structure shields 533A, 533D.

Thus, by incorporating the fourth dielectric material 537 as shown and described, the GCR should increase for the memory device of FIG. 5. The amount of increase in GCR is at least partially a function of the material chosen for the fourth dielectric material 537. For example, as the dielectric constant of the fourth dielectric material 537 decreases, the GCR increases commensurately. As the GCR increases, the biases applied to the various transistors can be reduced.

Figure 6:
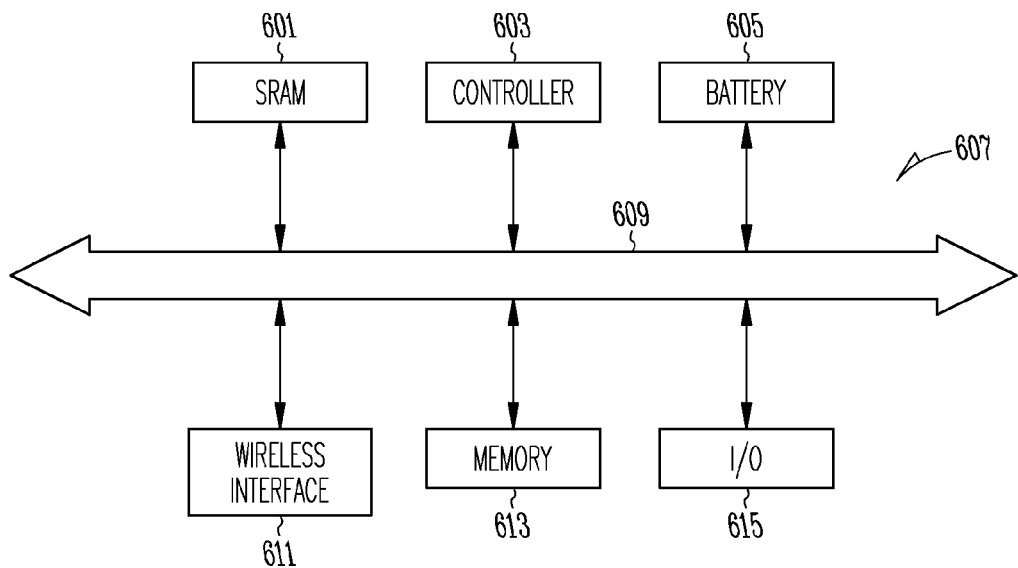
FIG. 6 shows a block diagram of a system embodiment, including a memory device.

With reference now to FIG. 6, a block diagram of an illustrative embodiment of an apparatus in the form of an electronic system 607 including one or more memory devices (e.g., the memory device 101 of FIG. 1) is shown. The system 607 may be used in devices such as, for example, a personal digital assistant (PDA), a laptop or portable computer with or without wireless capability, a web tablet, a wireless telephone, a pager, an instant messaging device, a digital music player, a digital camera, or other devices that may be adapted to transmit or receive information either wirelessly or over a wired connection. The system 607 may be used in any of the following systems: a wireless local area network (WLAN) system, a wireless personal area network (WPAN) system, or a cellular network.

The system 607 of FIG. 6 is shown to include a controller 603, an input/output (I/O) device 615 (e.g., a keypad, a touchscreen, or a display), a memory device 613, a wireless interface 611, and a static random access memory (SRAM) device 601 coupled to each other via a bus 609. A battery 605 may supply power to the system 607 in one embodiment. The memory device 613 may include a NAND memory, a flash memory, a NOR memory, a combination of these, or the like.

The controller 603 may include, for example, one or more microprocessors, digital signal processors, micro-controllers, or the like. The memory device 613 may be used to store information transmitted to or by the system 607. The memory device 613 may optionally also be used to store information in the form of instructions that are executed by the controller 603 during operation of the system 607 and may be used to store information in the form of user data either generated, collected, or received by the system 607 (such as image data). The instructions may be stored as digital information and the user data, as disclosed herein, may be stored in one section of the memory as digital information and in another section as analog information. As another example, a given section at one time may be labeled to store digital information and then later may be reallocated and reconfigured to store analog information. The controller 603 may include one or more of the novel memory devices described herein.

The I/O device 615 may be used to generate information. The system 607 may use the wireless interface 611 to transmit and receive information to and from a wireless communication network with a radio frequency (RF) signal. Examples of the wireless interface 611 may include an antenna, or a wireless transceiver, such as a dipole antenna. However, the scope of the inventive subject matter is not limited in this respect.

Also, the I/O device 615 may deliver a signal reflecting what is stored as either a digital output (if digital information was stored), or as an analog output (if analog information was stored). While an example in a wireless application is provided above, embodiments of the inventive subject matter disclosed herein may also be used in non-wireless applications as well. The I/O device 615 may include one or more of the novel memory devices described herein.

The various illustrations of the methods and apparatuses are intended to provide a general understanding of the structure of various embodiments and are not intended to provide a complete description of all the elements and features of the apparatuses and methods that might make use of the structures, features, and materials described herein.

The apparatuses of the various embodiments may include or be included in, for example, electronic circuitry used in high-speed computers, communication and signal processing circuitry, single or multi-processor modules, single or multiple embedded processors, multi-core processors, data switches, and application-specific modules including multilayer, multi-chip modules, or the like. Such apparatuses may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

A person of ordinary skill in the art will appreciate that, for this and other methods (e.g., programming or read operations) disclosed herein, the activities forming part of various methods may be implemented in a differing order, as well as repeated, executed simultaneously, or substituted one for another. Further, the outlined acts and operations are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as illustrations of various aspects. For example, instead of using floating gates as a charge storage structure, charge traps may be used instead. Many modifications and variations can be made, as will be apparent to a person of ordinary skill in the art upon reading and understanding the disclosure. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to comply with 37 C.F.R. §1.72(b), requiring an abstract allowing the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising a number of memory cells, each of the number of memory cells comprising:
   a channel material, the channel material comprising a semiconductor material having a substantially cylindrical cross-section;
   a charge storage structure;
   a first dielectric between the charge storage structure and the channel material;
   a plurality of control gates; and
   a second dielectric between each of the plurality of control gates and the charge storage structure.

2. The apparatus of claim 1, wherein the charge storage structure fully surrounds an outer periphery of the semiconductor material.

3. The apparatus of claim 2, wherein the first dielectric fully surrounds the outer periphery of the semiconductor material.

4. The apparatus of claim 1, wherein the second dielectric material is also between the semiconductor material and each of the plurality of control gates.

5. The apparatus of claim 1, wherein the charge storage structure is substantially toroidal in shape.

6. The apparatus of claim 1, wherein the charge storage structure has an inner surface in direct contact with the first dielectric.

7. The apparatus of claim 1, wherein the plurality of control gates comprises a pair of control gates.

8. The apparatus of claim 1, further comprising a third dielectric material between one of the plurality of control gates of a first one of the number of memory cells and an adjacent one of the plurality of control gates of a second one of the number of memory cells.

9. The apparatus of claim 8, wherein the third dielectric material comprises a low dielectric constant material.

10. The apparatus of claim 1, wherein each of the number of memory cells is configured to operate in a depletion mode.

11. The apparatus of claim 1, wherein none of the plurality of control gates are shared by adjacent memory cells in a string of memory cells including the number of memory cells.

12. The apparatus of claim 1, wherein the second dielectric material is comprised of a high dielectric constant material.

13. An apparatus comprising a number of memory cells, each of the number of memory cells comprising:
   a string of series-coupled non-volatile memory cells;
   a channel material;
   a charge storage structure;
   a first dielectric between the charge storage structure and the channel material;
   a control gate adjacent a first side of the charge storage structure, the control gate of a respective one of the number of memory cells in the string not being shared with an adjacent one of the number of memory cells in the string;
   a shield adjacent a second side of the charge storage structure; and
   a second dielectric between the control gate and the charge storage structure.

14. The apparatus of claim 13, wherein the number of memory cells comprises a string of memory cells and wherein the shield of a respective one of the memory cells of the string of memory cells also comprises the shield of an adjacent one of the memory cells of the string of memory cells.

15. The apparatus of claim 13, wherein the first dielectric comprises silicon dioxide.

16. An apparatus, comprising:
   a channel material;
   a dielectric surrounding an outer periphery of the channel material;
   a number of spaced-apart charge storage structures, each of the number of charge storage structures surrounding a respective portion of the dielectric;
   a number of spaced-apart control gates, each of the number of control gates surrounding a respective portion of the dielectric; and
   a number of spaced-apart shields, each of the number of shields surrounding a respective portion of the dielectric.

17. The apparatus of claim 16, wherein the channel material comprises a pillar of semiconductor material that has a cylindrical cross-section.

18. The apparatus of claim 16, wherein the dielectric comprises a first dielectric and further comprising a second dielectric, wherein the second dielectric is between each of the shields and a respective one of the number of charge storage structures, and wherein the second dielectric is between each of the number of control gates and a respective one of the charge storage structures.

19. The apparatus of claim 18, wherein adjacent ones of the number of control gates are separated by a third dielectric material.

20. The apparatus of claim 19, wherein each of the number of shields is separated from a respective one of the charge storage structures by the second dielectric and a fourth dielectric.

21. An apparatus, comprising:
   a semiconductor material;
   a tunnel dielectric surrounding an outer periphery of the semiconductor material;
   a number of spaced-apart charge storage structures, each of the number of charge storage structures surrounding a respective portion of the tunnel dielectric; and
   a number of spaced-apart pairs of control gates, each of the number of control gates surrounding a respective portion of the tunnel dielectric, each of the pairs of control gates and a respective one of the charge storage structures comprises a respective memory cell in a string of memory cells.

22. The apparatus of claim 21, wherein the apparatus comprises a memory device.

23. The apparatus of claim 21, wherein the apparatus comprises an electronic system including a memory device.

24. An apparatus comprising a number of memory cells, each of the number of memory cells comprising:
   a channel material;
   a charge storage structure;
   a first dielectric between the charge storage structure and the channel material;
   a plurality of control gates, none of the plurality of control gates being shared by adjacent memory cells in a string of memory cells including the number of memory cells; and
   a second dielectric between each of the plurality of control gates and the charge storage structure.

* * * * *